United States Patent
Chen et al.

(10) Patent No.: US 11,722,139 B2
(45) Date of Patent: Aug. 8, 2023

(54) FREQUENCY-LOCKED LOOP AND METHOD FOR CORRECTING OSCILLATION FREQUENCY OF OUTPUT SIGNAL OF FREQUENCY-LOCKED LOOP

(71) Applicant: MEDIATEK INC., Hsin-Chu (TW)

(72) Inventors: Chien-Wei Chen, Hsinchu (TW); Yu-Li Hsueh, Hsinchu (TW); Chao-Ching Hung, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 17/575,646

(22) Filed: Jan. 14, 2022

(65) Prior Publication Data

US 2022/0399897 A1 Dec. 15, 2022

Related U.S. Application Data

(60) Provisional application No. 63/209,026, filed on Jun. 10, 2021.

(51) Int. Cl.
*H03L 7/02* (2006.01)
*H03L 7/099* (2006.01)
(Continued)

(52) U.S. Cl.
CPC ............... *H03L 7/02* (2013.01); *H03L 1/02* (2013.01); *H03L 7/00* (2013.01); *H03L 7/0995* (2013.01)

(58) Field of Classification Search
CPC ..... H03L 7/02; H03L 1/02; H03L 7/00; H03L 7/0995
See application file for complete search history.

(56) References Cited

U.S. PATENT DOCUMENTS

| 5,963,105 A | * | 10/1999 | Nguyen | .................... H03L 7/00 331/1 R |
|---|---|---|---|---|
| 7,145,400 B2 | | 12/2006 | Horan | |
| 2012/0161868 A1 | * | 6/2012 | Yayama | .................... H03L 1/00 330/252 |

FOREIGN PATENT DOCUMENTS

| EP | 3 832 888 A1 | 6/2021 | |
|---|---|---|---|
| EP | 3923480 A1 * | 12/2021 | ............... H03L 7/02 |

(Continued)

OTHER PUBLICATIONS

Kamran Souri, "Precision MEMS-Based Frequency References", ISSCC, 2021, USA.

(Continued)

*Primary Examiner* — Ryan Johnson
(74) *Attorney, Agent, or Firm* — Winston Hsu

(57) ABSTRACT

A frequency-locked loop (FLL) and a method for correcting an oscillation frequency of an output signal of the FLL are provided. The FLL includes a switched capacitor circuit, a first resistor set, a second resistor set, a determination circuit and a control circuit. The switched capacitor circuit includes a capacitor, and connection of the capacitor is switched according to the oscillation frequency. The first resistor set is configured to provide a first resistance, and the second resistor set is configured to provide a second resistance. The determination circuit is configured to generate a determination result according to the first resistance and the second resistance. The control circuit is configured to generate a control signal for correcting the first resistance and the second resistance according to the determination result, where the oscillation frequency is determined based on the capacitor and at least one of the first resistance and the second resistance.

20 Claims, 11 Drawing Sheets

(51) Int. Cl.
*H03L 7/00* (2006.01)
*H03L 1/02* (2006.01)

(56) References Cited

FOREIGN PATENT DOCUMENTS

| TW | M459630 U1 | 8/2013 | | |
|---|---|---|---|---|
| TW | I722831 B | 3/2021 | | |
| WO | WO-2012137590 A1 | * | 10/2012 | ......... H01L 27/0802 |
| WO | 2016/039688 A1 | 3/2016 | | |

OTHER PUBLICATIONS

Giorgio Cristiano, Jiawei Liao, Alessandro Novello, Gabriele Atzeni, Taekwang Jang, "A 8.7ppm/°C, 694nW, One-Point Calibrated RC Oscillator Using a Nonlinearity-Aware Dual Phase-Locked Loop and DSM-Controlled Frequency-Locked Loops", 2020 IEEE Symposium on VLSI Circuits, USA.

Amr Khashaba, Junheng Zhu, Mostafa Ahmed, Nilanjan Pal, Pavan Kumar Hanumolu, "A 34μW 32MHz RC Oscillator with ±530ppm Inaccuracy from -40°C to 85°C and 80ppm/V Supply Sensitivity Enabled by Pulse-Density Modulated Resistors", ISSCC , 2020, IEEE, USA.

Myungjoon Choi et al., A 110 nW Resistive Frequency Locked on-Chip Oscillator with 34.3 ppm/°C Temperature Stability for System-on-Chip Designs, IEEE Journal of Solid-State Circuits, vol. 51, No. 9, Sep. 2016, p. 2106-2118, XP011622012, 2016/9.

Ken Ueno et al., A 30-MHz, 90-ppm/°C Fully-integrated Clock Reference Generator with Frequency-locked Loop, 2009 IEEE, p. 1-4, XP031563338, 2009 Proceedings of ESSCIRC, IEEE, Athens, Greece, 2009.

* cited by examiner

FREQUENCY-LOCKED LOOP AND METHOD FOR CORRECTING OSCILLATION FREQUENCY OF OUTPUT SIGNAL OF FREQUENCY-LOCKED LOOP

CROSS REFERENCE TO RELATED APPLICATIONS

This application claims the benefit of U.S. provisional application No. 63/209,026, which was filed on Jun. 10, 2021, and is included herein by reference.

BACKGROUND

The present invention is related to frequency correction of oscillators, and more particularly, to a frequency-locked loop (FLL) and a method for correcting an oscillation frequency of an output signal of the FLL.

For a free run ring oscillator, an oscillation frequency thereof is determined by delays of circuit stages of the ring oscillator. In particular, a delay of a single stage may be determined by a voltage swing of the single stage and equivalent resistances of charging and discharging path of the single stage. The voltage swing and the equivalent resistances mentioned above are sensitive to process corner variation and temperature variation, however. Proper correction mechanism may be required to correct the oscillation frequency.

In practice, when the ring oscillator has been fabricated, the oscillation frequency may be corrected under a room temperature such as 20 degrees Celsius (° C.), and the frequency drifting due to process corner variation can be trimmed by adjusting loading capacitors of the circuit stages. The ring oscillator will not always operate under a constant temperature, and the oscillation frequency still drifts in response to temperature variation. Related arts have proposed some techniques to detect the frequency drifting due to temperature variation, and the oscillation frequency can be accordingly corrected. However, the techniques of the related arts typically require additional circuits which greatly increase circuit area and complexity of an overall design. For example, one or more additional phase-locked loops (PLLs) may be required for detecting the frequency drifting, and an overall circuit area might be doubled or even more than that.

Thus, there is a need for a novel architecture, which can properly correct the oscillation frequency under a temperature varying environment without greatly increase an overall cost.

SUMMARY

An objective of the present invention is to provide a frequency-locked loop (FLL) and a method for correcting an oscillation frequency of an output signal of the FLL, to solve the problem of the related art (e.g., frequency drifting due to temperature variation) without introducing any side effect or in a way that is less likely to introduce side effects.

At least one embodiment of the present invention provides an FLL. The FLL comprises at least one switched capacitor circuit, a first resistor set, a second resistor set, a determination circuit and a control circuit. The at least one switched capacitor circuit comprises at least one capacitor, and connection of the at least one capacitor is switched according to an oscillation frequency of an output signal of the FLL. The first resistor set is configured to provide a first resistance, and the second resistor set is configured to provide a second resistance. The determination circuit is configured to generate a determination result according to the first resistance and the second resistance. The control circuit is configured to generate at least one control signal for correcting at least one of the first resistance and the second resistance according to the determination result. More particularly, the oscillation frequency is determined based on the at least one capacitor and the at least one of the first resistance and the second resistance.

At least one embodiment of the present invention provides a method for correcting an oscillation frequency of an output signal of an FLL. The method comprises: utilizing at least one switched capacitor circuit of the FLL to switch connection of at least one capacitor of the at least one switched capacitor circuit according to the oscillation frequency; utilizing a first resistor set of the FLL to provide a first resistance; utilizing a second resistor set of the FLL to provide a second resistance; utilizing a determination circuit of the FLL to generate a determination result according to the first resistance and the second resistance; utilizing a control circuit of the FLL to generate at least one control signal for correcting at least one of the first resistance and the second resistance according to the determination result. More particularly, the oscillation frequency is controlled by a capacitance of the at least one capacitor and the at least one of the first resistance and the second resistance.

The FLL and the method provided by the embodiments of the present invention can monitor resistance drifting of at least two resistors due to temperature variation, by detecting resistance difference between the two resistors. As the resistance of at least one of the two resistors is one of factors that determines the oscillation frequency, and is also a main factor which cause the frequency drifting due to temperature variation, the present invention can correct the oscillation frequency by correcting the resistance according to monitored resistance drifting. In addition, the embodiments of the present invention will not greatly increase overall costs. Thus, the present invention can solve the problem of the related art without introducing any side effect or in a way that is less likely to introduce side effects.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims, which refer to particular components. As one skilled in the art will appreciate, electronic equipment manufacturers may refer to a component by different names. This document does not intend to distinguish between components that differ in name but not in function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
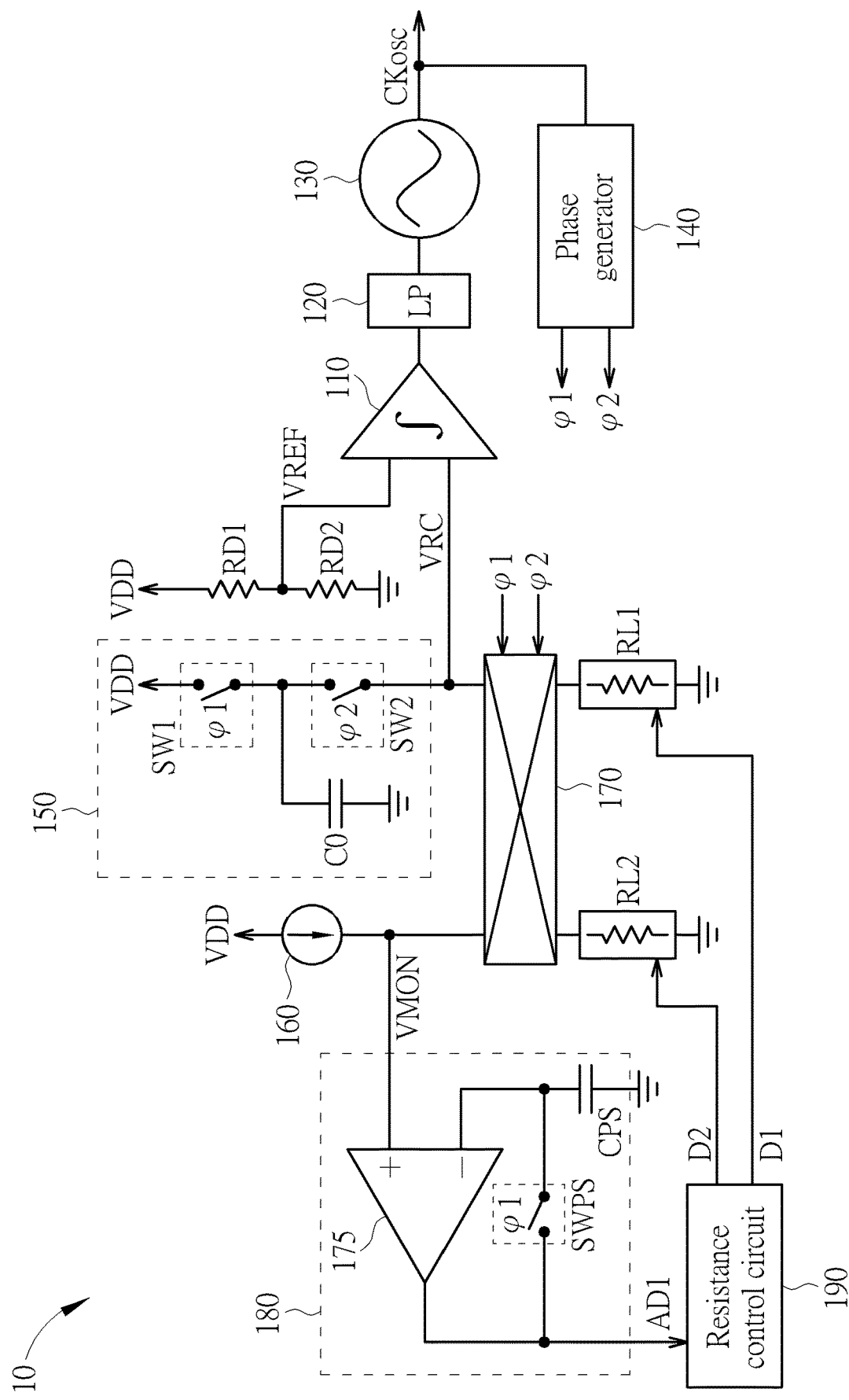
FIG. 1 is a diagram illustrating a frequency-locked loop (FLL) according to an embodiment of the present invention.

FIG. 1 is a diagram illustrating a frequency-locked loop 10 according to an embodiment of the present invention. The FLL 10 may comprise resistors RD1 and RD2, an integrator 110 (labeled "J" in figures for brevity), a loop filter 120 (labeled "LP" in figures for brevity), an oscillator 130 (represented by a circle with a sine wave therein) such as a ring oscillator, a phase generator 140 and at least one switched capacitor circuit such as a switched capacitor circuit 150. As shown in FIG. 1, the resistors RD1 and RD2 may be connected in series between a first reference voltage terminal (e.g., a terminal providing a supply voltage VDD) and a second reference voltage terminal (e.g., a terminal providing a ground voltage), in order to generate a reference voltage such as a voltage VREF on a first input terminal of the integrator 110, where assuming that a resistance of the resistor RD1 is (x×RD) and a resistance of the resistor RD2 is RD, the voltage VREF may be expressed as below.

$$VREF = VDD \times \frac{RD}{RD + x \times RD}$$

The switched capacitor circuit 150 may comprise a capacitor C0 and switches SW1 and SW2, where connection of the capacitor C0 is switched according to an oscillation frequency Fosc of an output signal CKosc of the FLL 10 (e.g., an output signal of the oscillator 130) with aid of the switches SW1 and SW2. For example, the phase generator 140 may generate two control signals φ1 and φ2 that are non-overlapping to each other according the output signal CKosc, where a frequency of each of the control signals φ1 and φ2 may be the oscillation frequency Fosc. The switches SW1 and SW2 may be controlled by the control signals φ1 and φ2, respectively, where when the control signal φ1 is at a logic high state (the control signal φ2 is at a logic low state), the capacitor C0 is coupled to the terminal providing the supply voltage VDD, and when the control signal φ2 is at the logic high state (the control signal φ1 is at the logic low state), the capacitor C0 is coupled to a second input terminal of the integrator 110.

In this embodiment, when a reference resistor is coupled to the second input terminal of the integrator 110, a combined network comprising the switched capacitor circuit 150 and the reference resistor may generate a voltage VRC on the second input terminal of the integrator 110, where assuming that a resistance of the reference resistor is $R_R$ and a capacitance of the capacitor C0 is $C_R$, the voltage VRC may be expressed as below.

$$VCR = \frac{R_R}{R_R + 1/(Fosc \times C_R)}$$

As the integrator 110, the loop filter 120, the oscillator 130, the phase generator 140 and the combined network (which comprises the switched capacitor circuit 150 and the reference resistor) forms a close loop, the first input terminal of the integrator 110 and the second input terminal of the integrator 110 may be virtual short, and the voltage on the first input terminal (i.e., VREF) of the integrator 110 and the voltage on the second input terminal (i.e., VRC) of the integrator 110 may be identical or substantially identical to each other. Thus, the oscillation frequency Fosc may be expressed as below.

$$Fosc = \frac{x}{R_R \times C_R}$$

According to the expression shown above, the oscillation frequency Fosc is determined based on a resistance ratio of the resistors RD1 and RD2 (i.e., "x"), the resistance of the reference resistor (i.e., "$R_R$") and the capacitance of the capacitor C0 (i.e., "$C_R$"). In practice, the ratio of the resistors RD1 and RD2 is constant and does not be changed due to temperature variation. In addition, a temperature coefficient of a capacitor is typically much smaller than a temperature coefficient of a resistor, and therefore the drifting of the capacitance of the capacitor C0 due to temperature variation may be ignorable. Thus, the present invention aims at correcting the resistance of the reference resistor, in order to correct the oscillation frequency Fosc.

In this embodiment, the FLL 10 may further comprise a first resistor set RL1, a second resistor set RL2, a current source such as a band gap (BG) current source 160, a swapping circuit 170, a determination circuit 180, a control circuit such as a resistance control circuit 190. The first resistor set RL1 is configured to provide a first resistance, and the second resistor set RL2 is configured to provide a second resistance. The BG current source 160 is coupled to the determination circuit 160, and is configured to provide a constant current (e.g., a temperature-invariant current). The swapping circuit 170 is coupled to the first resistor set RL1, the second resistor set RL2 and the switched capacitor circuit 150, where the swapping circuit 170 is configured to select one of the first resistor set RL1 and the second resistor set RL2 to be coupled to the second terminal, where the other one of the first resistor set RL1 and the second resistor set RL2 may be coupled to the BG current source 160. When a resistor (e.g., one of the first resistor set RL1 and the second resistor set RL2) is coupled to the BG current source 160, a monitored voltage VMON may be generated according to a resistance of this resistor.

Figure 2:
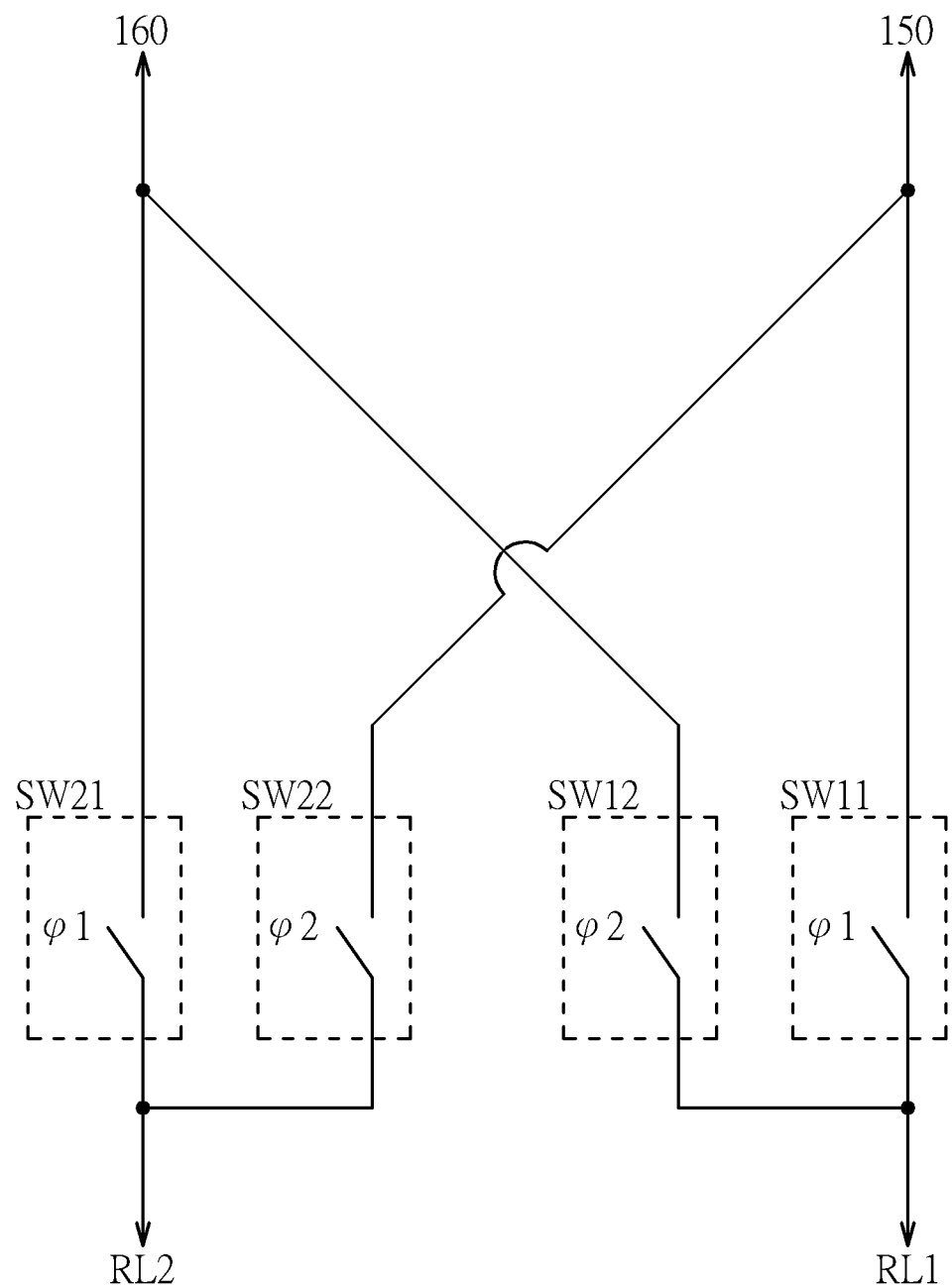
FIG. 2 is a diagram illustrating some implementation details of a swapping circuit shown in FIG. 1 according to an embodiment of the present invention.

FIG. 2 is a diagram illustrating some implementation details of the swapping circuit 170 according to an embodiment of the present invention. As shown in FIG. 2, the swapping circuit 170 may comprise switches SW11, SW12, SW21 and SW22. The switch SW11 is coupled between the first resistor set RL1 and the switched capacitor circuit 150, and may be controlled by the control signal φ1. The switch SW12 is coupled between the first resistor set RL1 and the BG current source 160, and may be controlled by the control signal φ2. The switch SW21 is coupled between the second resistor set RL2 and the BG current source 160, and may be controlled by the control signal φ1. The switch SW22 is coupled between the second resistor set RL2 and the switched capacitor circuit 150, and may be controlled by the control signal φ2.

When the control signal φ1 is at the logic high state and the control signal φ2 is at the logic low state (which may be regarded as a first phase), the switches SW11 and SW21 are turned on and the switches SW12 and SW22 are turned off, the swapping circuit 170 may control the first resistor set RL1 to be coupled to the switched capacitor circuit 150 and controls the second resistor set RL2 to be coupled to the BG current source 160. The first resistor set RL1 may be an example of the reference resistor mentioned above during the first phase, and the oscillation frequency Fosc may be FRL1, which is determined based on the first resistance, where the monitored voltage VMON may be a second monitored voltage which is generated according to the second resistance and the constant current of the BG current source 160. When the control signal φ2 is at the logic high state and the control signal φ1 is at the logic low state (which may be regarded as a second phase), the switches SW12 and SW22 are turned on and the switches SW11 and SW21 are turned off, the swapping circuit 170 may control the second resistor set RL2 to be coupled to the switched capacitor circuit 150 and controls the first resistor set RL1 to be coupled to the BG current source 160. The second resistor set RL2 may be an example of the reference resistor mentioned above during the second phase, and the oscillation frequency Fosc may be FRL2, which is determined based on the second resistance, where the monitored voltage VMON may be a first monitored voltage which is generated according to the first resistance and the constant current of the BG current source 160.

In one embodiment, the first resistor set RL1 and the second resistor set RL2 may be implemented by different materials, to make a first temperature coefficient of the first resistor set RL1 be different from a second temperature coefficient of the second resistor set RL2. For example, a resistance shifting amount of the first resistor set RL1 in response to a temperature shifting amount may be different from a resistance shifting amount of the second resistor set RL2 in response to this temperature shifting amount. Thus, the drifting of the oscillation frequency FRL1 corresponding to the first resistor set RL1 may be different from drifting of the oscillation frequency FRL2 corresponding to the second resistor set RL2. In practice, both of the first resistance and the second resistance may be corrected to the resistance which is able to make the FLL 10 have a target frequency under a predetermined temperature such as 20 degrees Celsius (° C.), where the first resistance and the second resistance are corrected to be identical to each other under this predetermined temperature. When an environment temperature is different from the predetermined temperature, as the first temperature coefficient of the first resistor set RL1 is different from the second temperature coefficient of the second resistor set RL2, a resistance difference between the first resistor set RL1 and the second resistor set RL2 may exist, and a voltage difference between the first monitored voltage and the second monitored voltage may be detected.

The determination circuit 180 shown in FIG. 1 is configured to generate a determination result AD1 according to the first resistance and the second resistance. The resistance control circuit 190 shown in FIG. 1 is configured to generate at least one control signal for correcting at least one of the first resistance and the second resistance according to the determination result AD1. For example, the resistance control circuit 190 may generate control signals D1 and D2 according to the determination result AD1, where the resistance control circuit 190 may utilize the control signal D1 for correcting the first resistance of the first resistor set RL1, and may utilize the control signal D2 for correcting the second resistance of the second resistor set RL2. When the determination result AD1 indicates that the first monitored voltage is greater than the second monitored voltage, the resistance control circuit 190 may utilize the control signal D1 to decrease the first resistance and utilize the control signal D2 to increase the second resistance. When the determination result AD1 indicates that the first monitored voltage is less than the second monitored voltage, the resistance control circuit 190 may utilize the control signal D1 to increase the first resistance and utilize the control signal D2 to decrease the second resistance. In one embodiment, the resistance control circuit 190 may comprise a lookup table built therein, and the lookup table records a relationship between the determination result AD1 (which indicates whether the environment temperature is higher or lower than the predetermined temperature) and the required correcting direction of the at least one (e.g. each) of the first resistance and the second resistance, and the resistance control circuit 190 may thereby output the control signals D1 and/or D2 in response to the temperature variation according to the determination result AD1.

In one embodiment, any (e.g., each) of the first resistor set RL1 and the second resistor set RL2 is a resistor ladder. For example, the resistor ladder may comprise multiple segments of resistors respectively coupled to multiple switches, and the resistance control circuit 190 may utilize the aforementioned at least one control signal (e.g., the control signals D1 and/or D2) to control the multiple switches for controlling an equivalent resistance of the resistor ladder, but the present invention is not limited thereto.

In the embodiment of FIG. 1, the determination circuit 180 may comprise an amplifier 175, a preset capacitor CPS and a preset switch SWPS. The amplifier 175 is coupled to the BG current source 160, and is configured to receive the first monitored voltage and the second monitored voltage via a first input terminal (labeled "+" in FIG. 1 for brevity) of the amplifier 175, for example, one at a time. The preset capacitor CPS is coupled to a second input terminal (labeled "−" in FIG. 1 for brevity) of the amplifier 175, and is configured to store at least one of the first monitored voltage and the second monitored voltage. The preset switch SWPS is coupled between the second input terminal and an output terminal of the amplifier 175, and is configured to control configurations of the determination circuit 180.

Figure 3A:
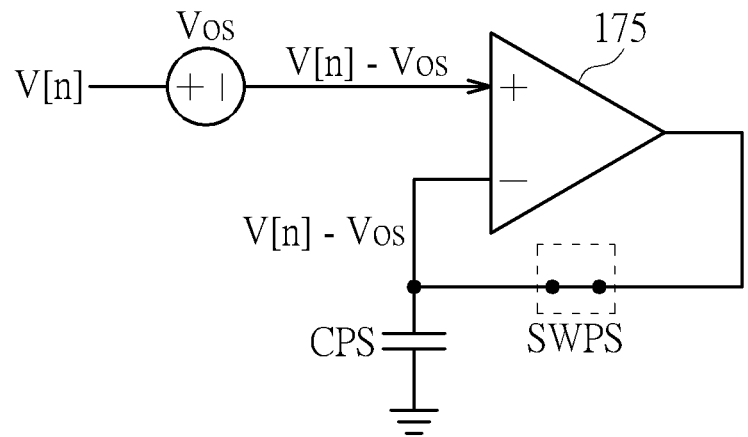
FIG. 3A is a diagram illustrating a determination circuit shown in FIG. 1 operating at a preset status during a first phase according to an embodiment of the present invention.
Figure 3B:
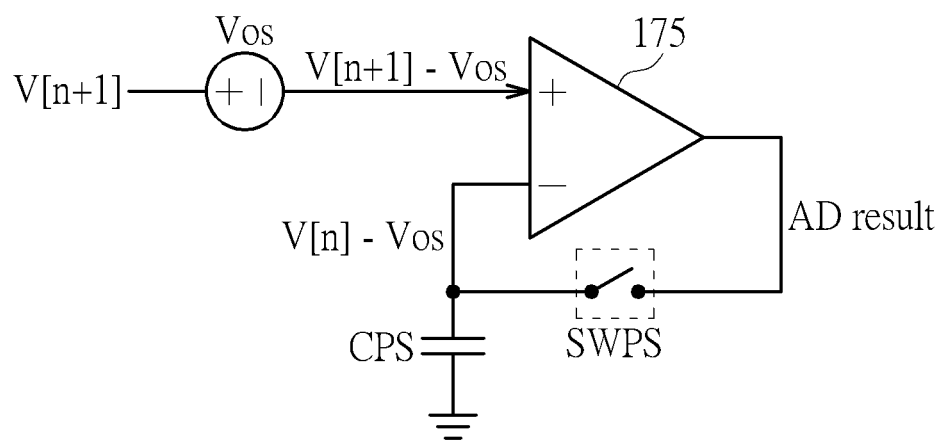
FIG. 3B is a diagram illustrating a determination circuit shown in FIG. 1 operating at an evaluation status during a second phase according to an embodiment of the present invention.
Figure 4:
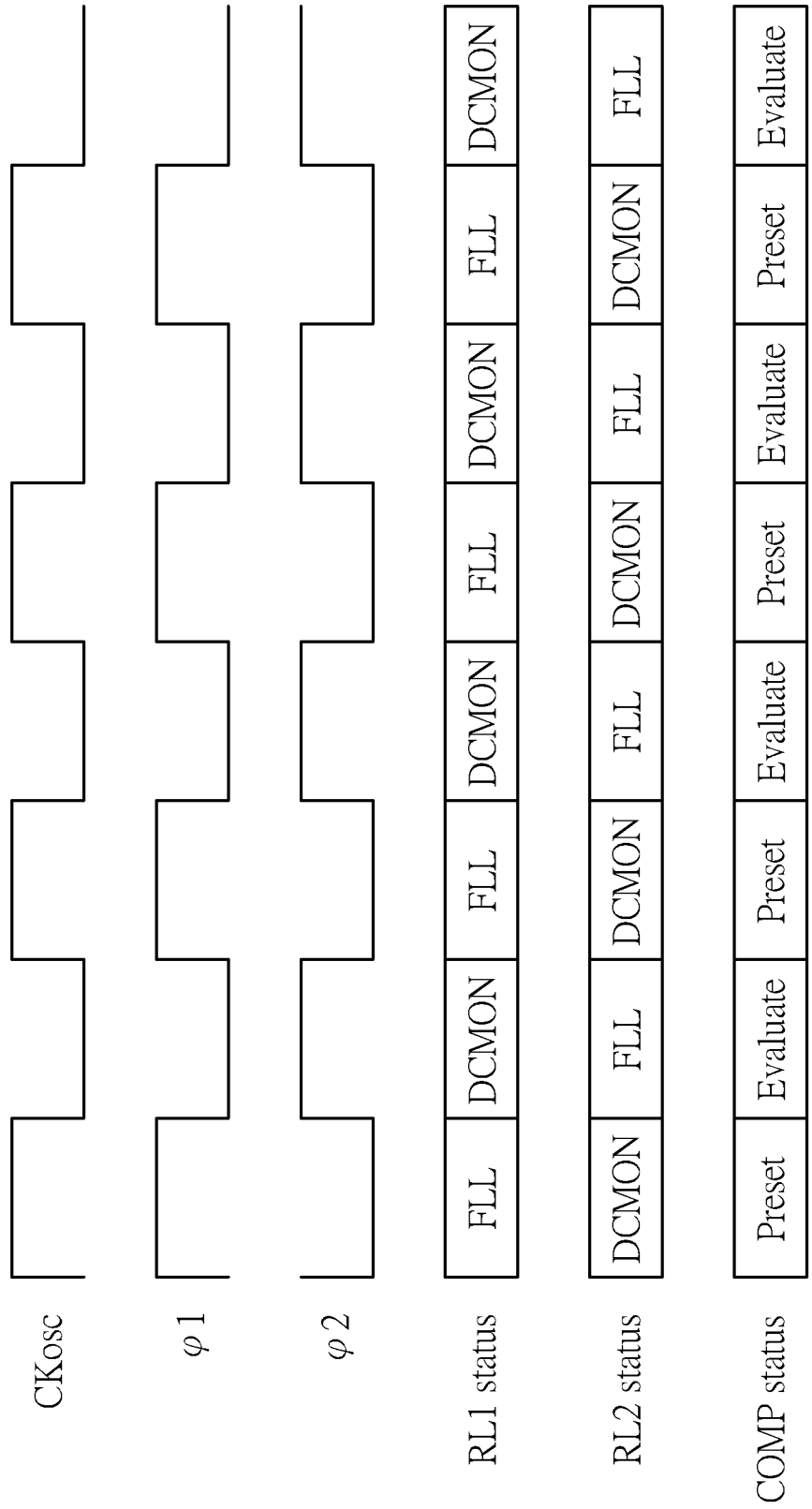
FIG. 4 is a diagram illustrating timing of some signals, statuses of resistor sets and status of the determination circuit shown in FIG. 1 according to an embodiment of the present invention.

For better comprehension, please refer to FIG. 3A and FIG. 3B in conjunction with FIG. 4. FIG. 3A is a diagram illustrating the determination circuit 180 operating at a preset status during the first phase according to an embodiment of the present invention. FIG. 3B is a diagram illustrating the determination circuit 180 operating at an evaluation status during the second phase according to an embodiment of the present invention. FIG. 4 is a diagram illustrating timing of the output signal CKosc, the control signals φ1 and φ2, and statuses of the first resistor set RL1 (labeled "RL1 status" in FIG. 4), the second resistor set RL2 (labeled "RL2 status" in FIG. 4) and the determination circuit 180 (labeled "COMP status" in FIG. 4) according to an embodiment of the present invention.

During the first phase, the first resistor set RL1 is coupled to the switched capacitor circuit 150 and the integrator 110 for controlling the oscillation frequency Fosc of the FLL 10, and the first resistor set RL1 may be regarded as operating at an FLL status (labeled "FLL" in FIG. 4 for brevity). The second resistor set RL2 is coupled to the BG current source 160 and the determination circuit 180 for generating the monitored voltage VMON (e.g., the second monitored voltage such as V[n] shown in FIG. 3A), and the second resistor set RL2 may be regarded as operating at an direct current (DC) monitor status (labeled "DCMON" in FIG. 4 for brevity). In addition, the preset switch SWPS is turned on, and the determination circuit 180 is configured as a unit gain buffer to replicate the monitored voltage V[n] from the first input terminal of the amplifier 175 to the preset capacitor CPS (e.g., to the second input terminal of the amplifier 175), where the determination circuit 180 may be regarded as operating at the preset status (labeled "Preset" in FIG. 4 for brevity).

During the second phase, the first resistor set RL1 is coupled to the BG current source 160 and the determination circuit 180 for generating the monitored voltage VMON (e.g., the first monitored voltage such as V[n+1]), and the first resistor set RL1 may be regarded as operating at the DC monitor status (labeled "DCMON" in FIG. 4 for brevity). The second resistor set RL2 is coupled to the switched capacitor circuit 150 and the integrator 110 for controlling the oscillation frequency Fosc of the FLL 10, and the second resistor set RL2 may be regarded as operating at the FLL status (labeled "FLL" in FIG. 4 for brevity). In addition, the preset switch SWPS is turned off, and the determination circuit 180 is configured as a comparator to compare the monitored voltage V[n+1] on the first input terminal of the amplifier with the monitored voltage V[n] stored on the preset capacitor CPS, in order to generate the determination result AD1, where the determination circuit 180 may be regarded as operating at the evaluation status (labeled "Evaluate" in FIG. 4 for brevity).

In practice, an intrinsic offset Vos caused by mismatch of the first input terminal and the second input terminal of the amplifier 175 may exist. Based on the operations shown in FIG. 3A and FIG. 3B, impact from the intrinsic offset Vos may be removed from the determination result AD1. For example, when the monitored voltage V[n] is replicated from the first input terminal of the amplifier 175 to the second input terminal of the amplifier 175 during the first phase (e.g., the preset phase of the determination circuit 180), the intrinsic offset Vos can be stored on the preset capacitor CPS in conjunction with the monitored voltage V[n], so the preset capacitor CPS may store a voltage "V[n]−Vos" as shown in FIG. 3A; and during the second phase (e.g., the evaluation phase of the determination circuit 180), the monitored voltage V[n+1] may exist on the first terminal of the amplifier 175 in conjunction with the intrinsic offset Vos (e.g., a voltage "V[n+1]−Vos" is on the first terminal of the amplifier 175) as shown in FIG. 3B. As both of the resultant voltage (V[n+1]−Vos) on the first input terminal and the resultant voltage (V[n]−Vos) on the second input terminal of the amplifier 175 have the intrinsic offset Vos, the determination result AD1 (labeled "AD result" in FIG. 3B) will not be affected by the intrinsic offset Vos.

It should be noted that the preset switch SWPS does not have to be controlled by the control signal φ1. In some embodiment, the preset switch SWPS may be controlled by the control signal φ2, where the determination circuit 180 may operate at the preset status during the second phase and operate at the evaluate status during the first phase. In some embodiment, as the temperature of the first resistor set RL1 and the second resistor set RL2 do not vary rapidly in practice, the swapping circuit 170 and the determination circuit 180 (e.g., the preset switch SWPS therein) may be controlled by other signals that have a frequency lower than that of the control signals φ1 and φ2, where the first resistor set RL1 may be coupled to the switched capacitor circuit 150 and the integrator 110 most of the time, and may be coupled to the BG current source 160 and the determination circuit 180 once in a while (e.g., once every predetermine periods) for monitoring the resistance difference between the first resistor set RL1 and the second resistor set RL2 due to temperature variation, but the present invention is not limited thereto.

Figure 5A:
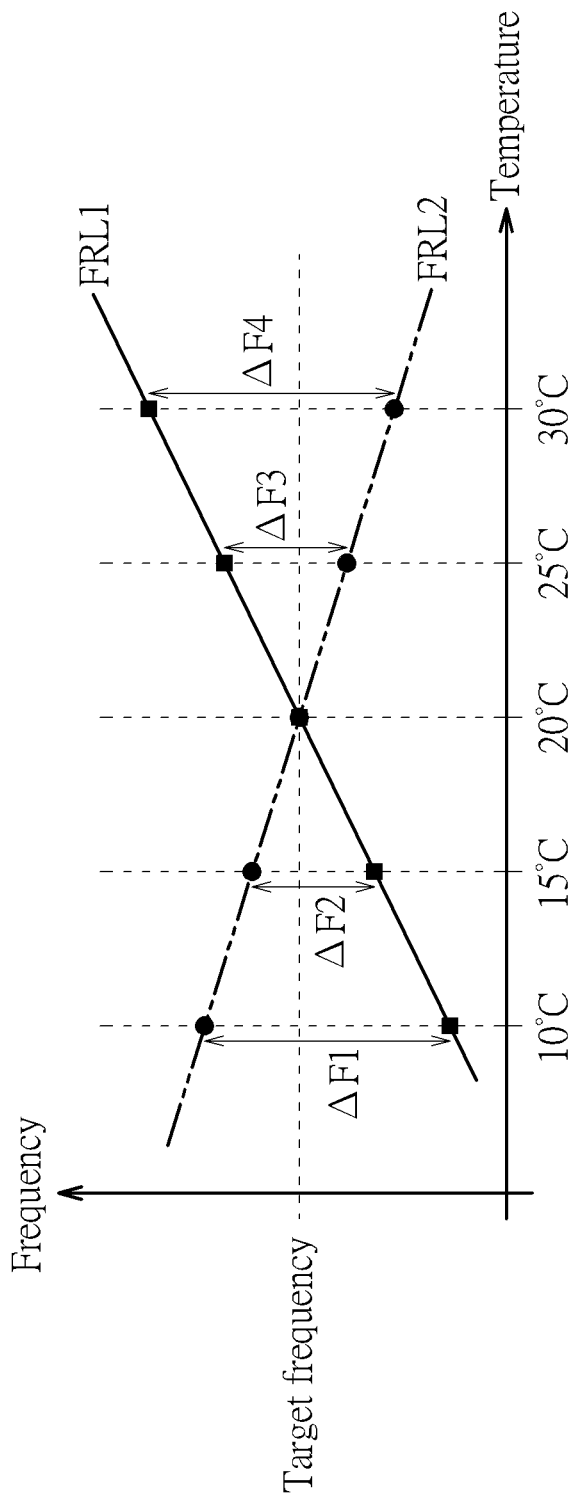
FIG. 5A is a diagram illustrating oscillation frequencies being corrected under a predetermined temperature during a testing procedure after the FLL shown in FIG. 1 being fabricated according to an embodiment of the present invention.

FIG. 5A is a diagram illustrating the oscillation frequency Fosc being corrected under the predetermined temperature during a testing procedure after the FLL 10 shown in FIG. 1 being fabricated according to an embodiment of the present invention. As shown in FIG. 5A, the oscillation frequency FRL1 corresponding to the resistor set RL1 and the oscillation frequency FRL2 corresponding to the resistor set RL2 may be corrected to be identical to each other under the predetermined temperature such as 20° C., where both of the oscillation frequencies FRL1 and FRL2 are corrected to the target frequency. In addition, frequency differences between the oscillation frequencies FRL1 and FRL2 under different temperatures such as 10° C., 15° C., 25° C. and 30° C. may be ΔF1, ΔF2, ΔF3 and ΔF4, respectively, where the frequency differences ΔF1, ΔF2, ΔF3 and ΔF4 may correspond to resistance differences between the first resistor set RL1 and the second resistor set RL2. Thus, the resistance control circuit 190 may correct the first resistance of the first resistor set RL1 and the second resistance of the second resistor set RL2 in response to the determination result AD1 (which indicates a comparison result or a detection result related to the first resistance and the second resistance) from the determination circuit 180.

Figure 5B:
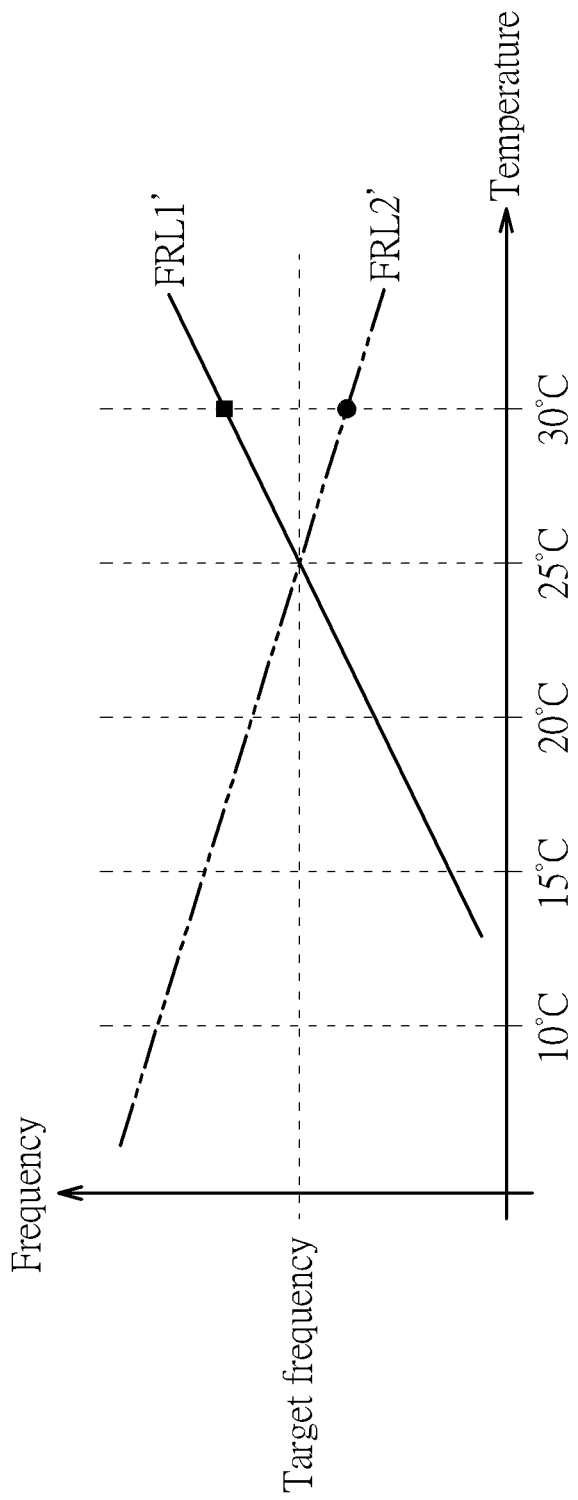
FIG. 5B is a diagram illustrating the oscillation frequencies shown in FIG. 5A being corrected under a drifted temperature according to an embodiment of the present invention.
Figure 5C:
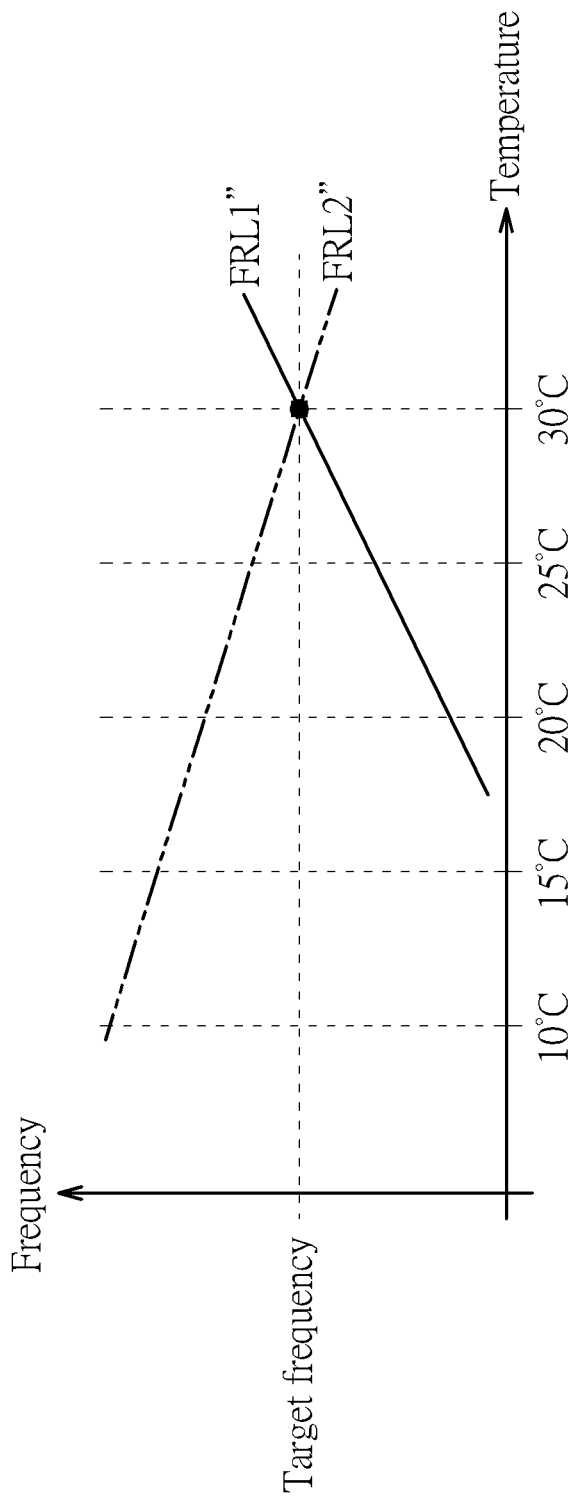
FIG. 5C is a diagram illustrating the oscillation frequencies shown in FIG. 5A being corrected again under a drifted temperature according to an embodiment of the present invention.

When the environment temperature is at 30° C., the determination result AD1 may indicate that the first monitored voltage is less than the second monitored voltage (which results in FRL1>FRL2), and the resistance control circuit 190 may correct the first resistance and the second resistance (e.g., increasing the first resistance and decreasing the second resistance) to shift the oscillation frequencies FRL1 and FRL2 to FRL1' and FRL2' shown in FIG. 5B. If the determination result AD1 indicates that the first monitored voltage is still less than the second monitored voltage (which results in FRL1>FRL2 as shown in FIG. 5B), the resistance control circuit 190 may correct the first resistance and the second resistance again (e.g., increasing the first resistance and decreasing the second resistance again) to shift the oscillation frequencies FRL1' and FRL2' to FRL1" and FRL2" shown in FIG. 5C. Thus, the oscillation frequencies respectively corresponding to the first resistor set RL1 and the second resistor set RL2 may be corrected to the target frequency.

Figure 6:
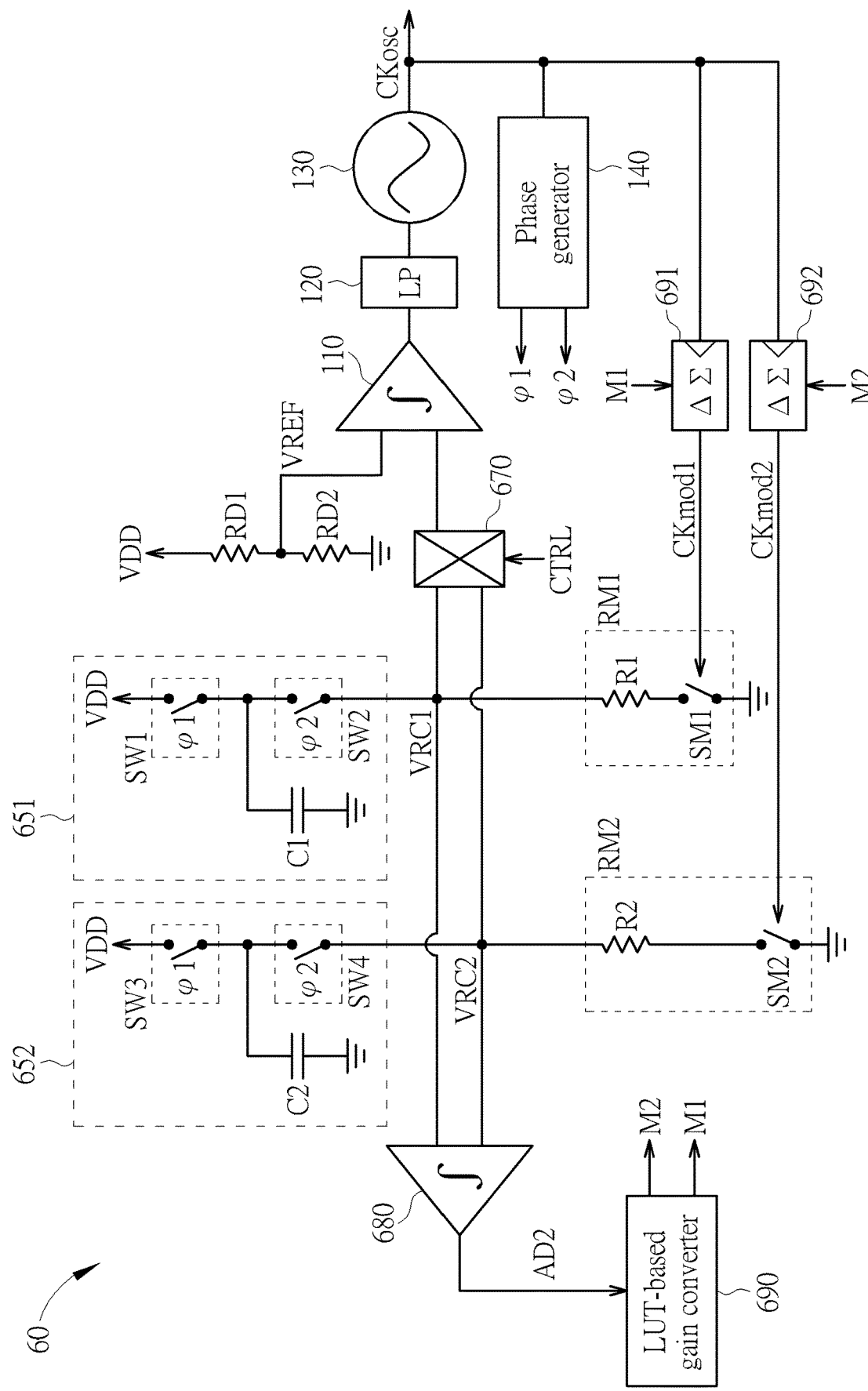
FIG. 6 is a diagram illustrating an FLL according to an embodiment of the present invention.

FIG. 6 is a diagram illustrating an FLL 60 according to an embodiment of the present invention. In addition to the resistors RD1 and RD2, the integrator 110, the loop filter 120, the oscillator 130 and the phase generator 140 which have been mentioned in the embodiment of FIG. 1, the FLL 60 may further comprise a first resistor set RM1, a second resistor set RM2, a first switched capacitor circuit 651, a second switched capacitor circuit 652, a swapping circuit 670, an integrator 680, an LUT-based gain converter 690, and at least one delta-sigma modulator such as delta signal modulators 691 and 692 (labeled "ΔΣ" in FIG. 6 for brevity). As shown in FIG. 6, the first switched capacitor circuit 651 is coupled to the first resistor set RM1, where connection of a first capacitor C1 of the first switched capacitor circuit 651 is switched according to the oscillation frequency Fosc. The second switched capacitor circuit 652 is coupled to the second resistor set RM2, wherein connection of a second capacitor C2 of the second switched capacitor circuit 652 is switched according to the oscillation frequency Fosc. In detail, each of the first switched capacitor circuit 651 and the second switched capacitor circuit 652 may be an example of the switched capacitor circuit 150 shown in FIG. 1. For example, switches SW1 and SW3 are controlled by the control signal φ1 for switching the connection of the first capacitor C1, and switches SW2 and SW4 are controlled by the control signal φ2 for switching the connection of the second capacitor C2. Related details of each of the first switched capacitor circuit 651 and the second switched capacitor circuit 652 are similar to that of the switched capacitor circuit 150, and are not repeated here for brevity.

In this embodiment, the swapping circuit 670 is configured to select one of a first combined network and a second combined network to be coupled to the second input terminal of the integrator 110, where the first combined network comprises the first switched capacitor circuit 651 and the first resistor set RM1, and the second combined network comprises the second switched capacitor circuit 652 and the second resistor set RM2. More particularly, when the first combined network is coupled to the second input terminal of the integrator 110, the first resistor set RM1 may be an example of the reference resistor mentioned above, and the oscillation frequency Fosc may be determined based on the first capacitor C1 and the first resistor set RM1; and when the second combined network is coupled to the second input terminal of the integrator 110, the second resistor set RM2 may be an example of the reference resistor mentioned above, and the oscillation frequency Fosc may be determined based on the second capacitor C2 and the second resistor set RM2.

In this embodiment, any resistor set of the first resistor set RM1 and the second resistor set RM2 is controlled by a modulation signal, and an equivalent resistance of this resistor set is determined according to a duty cycle of this modulation signal. In particular, the first resistor set RM1 may comprise a resistor R1 and a modulation switch SM1 coupled to the resistor R1, and the modulation switch SM1 is controlled by a modulation signal CKmod1 which is generated according to a control signal M1, where a first equivalent resistance of the first resistor set RM1 is determined according to a duty cycle of the modulation signal CKmod1. For example, the delta-sigma modulator 691 is configured to modulate the output signal CKosc according to the control signal M1, in order to generate the modulation signal CKmod1, where the delta-sigma modulator 691 may control an average duty cycle of the modulation signal CKmod1 according to the control signal M1, and the first equivalent resistance of the first resistor set RM1 may be expressed as (M1×R1). Thus, the value of the control signal M1 may be regarded as a gain of the first resistor R1. The second resistor set RM2 may comprise a resistor R2 and a modulation switch SM2 coupled to the resistor R2, and the modulation switch SM2 is controlled by a modulation signal CKmod2 which is generated according to a control signal M2, where a second equivalent resistance of the second resistor set RM2 is determined according to a duty cycle of the modulation signal CKmod2. For example, the delta-sigma modulator 692 is configured to modulate the output signal CKosc according to the control signal M2, in order to generate the modulation signal CKmod2, where the delta-sigma modulator 692 may control an average duty cycle of the modulation signal CKmod2 according to the control signal M2, and the second equivalent resistance of the second resistor set RM2 may be expressed as (M2×R2). Thus, the value of the control signal M2 may be regarded as a gain of the second resistor R2.

During a testing procedure after the FLL 60 being fabricated, when a control signal CTRL is at a first logic state, the swapping circuit 670 may select the first combined network to be coupled to the second terminal of the integrator 110, and the oscillation frequency Fosc may be F1 which is determined based on the control signal M1, the resistor R1 and the capacitor C1 as below.

$$F1 = \frac{1}{M1 \times R1 \times C1}$$

The control signal M1, the resistor R1 and/or the capacitor C1 may be corrected to make the FLL 60 have a target frequency under a predetermined temperature such as 20° C.; and when the control signal CTRL is at a second logic state different from the first logic state, the swapping circuit 670 may select the second combined network to be coupled to the second terminal of the integrator 110, and the oscillation frequency Fosc may be F2 which is determined based on the control signal M2, the resistor R2 and the capacitor C2 as below.

$$F2 = \frac{1}{M2 \times R2 \times C2}$$

The control signal M2, the resistor R2 and/or the capacitor C2 may be corrected to make the FLL 60 have the target frequency under the predetermined temperature such as 20° C. Thus, after both of the oscillation frequency F1 and the oscillation frequency F2 have been corrected, the oscillation frequency F1 may be identical to the oscillation frequency F2 under the predetermined temperature such as 20° C., the control signal CTRL may be fixed at one of the first logic state and the second logic state. For better comprehension, it is assume that the control signal CTRL is fixed at the first logic state after the correction of the oscillation frequency F1 and the oscillation frequency F2 is finished, and the swapping circuit 670 may always select the first combined network to be coupled to the second terminal of the integrator 110 from now on. It should be noted that the equations of F1 and F2 shown above is derived based on a condition where the resistance ratio of the resistors RD1 and RD2 is "1" (i.e., x=1) for brevity, but the present invention is not limited thereto.

In this embodiment, the first combined network (which comprises the first switched capacitor circuit 651 and the first resistor set RM1) may generate a first monitored voltage VRC1 on a first input terminal of the integrator 680, where the first monitored voltage VRC1 may be expressed as below.

$$VRC1 = \frac{VDD \times M1 \times R1}{\frac{1}{F1 \times C1} + M1 \times R1} = \frac{VDD \times M1 \times R1}{\frac{M1 \times R1 \times C1}{C1} + M1 \times R1} =$$

$$\frac{VDD \times M1 \times R1 \times C1}{M1 \times R1 \times C1 + M1 \times R1 \times C1} = VDD \times \frac{F1}{F1 + F1}$$

In addition, the second combined network (which comprises the second switched capacitor circuit 652 and the second resistor set RM2) may generate a second monitored voltage VRC2 on a second input terminal of the integrator. Based on the configuration of selecting the first combined network to be coupled to the second terminal of the integrator 110, the connection of the capacitor C2 is switched based on the oscillation frequency F1, and therefore the second monitored voltage VRC2 may be expressed as below.

$$VRC2 = \frac{VDD \times M2 \times R2}{\frac{1}{F1 \times C2} + M2 \times R2} = \frac{VDD \times M2 \times R2}{\frac{M1 \times R1 \times C1}{C2} + M2 \times R2} =$$

$$\frac{VDD \times M2 \times R2 \times C2}{M1 \times R1 \times C1 + M2 \times R2 \times C2} = VDD \times \frac{F1}{F1 + F2}$$

Under the predetermined temperature such as 20° C., VRC1=VRC2. When the environment temperature drifts away from the predetermined temperature, the first monitored voltage VRC1 may be kept the same (e.g., being tied at the voltage level same as the first input terminal of the integrator 110) due to the close loop of the FLL 60, but the second monitored voltage VRC2 may change. In particular, based on the equation related to the second monitored voltage VRC2 shown above, when the oscillation frequencies F1 and F2 drift (e.g., the oscillation frequency F1 and the oscillation frequency F2 becomes different from each other) due to the environment temperature drifting away from the predetermined temperature, the second monitored voltage VRC2 may change. Thus, the information related to the temperature drifting can be obtained from detection of the second monitored voltage VRC2 (e.g., detection of a voltage difference between the first monitored voltage VRC1 and the second monitored voltage VRC2).

In this embodiment, operations of the integrator 680 are similar to the determination circuit 180 shown in FIG. 1, where the integrator 680 may generate a determination result AD2 according to the first monitored voltage VRC1 and the second monitored voltage VRC2. For example, if F1>F2 due to the environment temperature drifting away from the predetermined temperature, the second monitored voltage VRC2 may be greater than the first monitored voltage VRC1, and a voltage level of the determination result AD2 may be accumulated in a first direction (e.g., toward the ground voltage); and if F1<F2 due to the environment temperature drifting away from the predetermined temperature, the second monitored voltage VRC2 may be less than the first monitored voltage VRC1, and the voltage level of the determination result AD2 may be accumulated in a second direction different from the first direction (e.g., toward the supply voltage VDD).

In this embodiment, the LUT-based gain converter 690 may generate the control signals M1 and M2 for correcting the first resistor set RM1 and the second resistor set RM2 according to the determination result AD2. In one embodiment, the LUT-based gain converter 690 may comprise a lookup table built therein, which records a relationship between the determination result AD2 (which indicates that whether the first monitored voltage VRC1 is higher or lower than the second monitored voltage VRC2) and the required correcting direction of the at least one (e.g. each) of the first equivalent resistance and the second equivalent resistance. For example, when the determination result AD2 indicates that VRC1<VRC2 (which means F1>F2), the LUT-based gain converter 690 may modify values of the control signals M1 and/or M2, in order to increase the first equivalent resistance of the first resistor set RM1 and/or decrease the second equivalent resistance of the second resistor set RM2; and when the determination result AD2 indicates that VRC1>VRC2 (which means F1<F2), the LUT-based gain converter 690 may modify values of the control signals M1 and/or M2, in order to decrease the first equivalent resistance of the first resistor set RM1 and/or increase the second equivalent resistance of the second resistor set RM2. In another example, corrected values of the control signals M1 and M2 corresponding to different levels of the determination result AD2 may be recorded in a lookup table built in the LUT-based gain converter 690, and the LUT-based gain converter 690 may refer the lookup table according to the voltage level of the determination result AD2, in order to output the corrected values of the control signals M1 and M2 for correcting the first equivalent resistance of the first resistor set RM1 and the second equivalent resistance of the second resistor set RM2, and thereby correcting the oscillation frequency Fosc, but the present invention is not limited thereto. For example, when values of the control signals M1 and M2 are corrected in response to the determination result AD1, the average duty cycles of the modulation signals CKmod1 CKmod2 respectively output from the delta-sigma modulators 691 and 692 may be corrected, thereby correcting the oscillation frequency F1 (which is equal to "1/(M1×R1×C1)") and the oscillation frequency F2 (which is equal to "1/(M2×R2×C2)").

Figure 7:
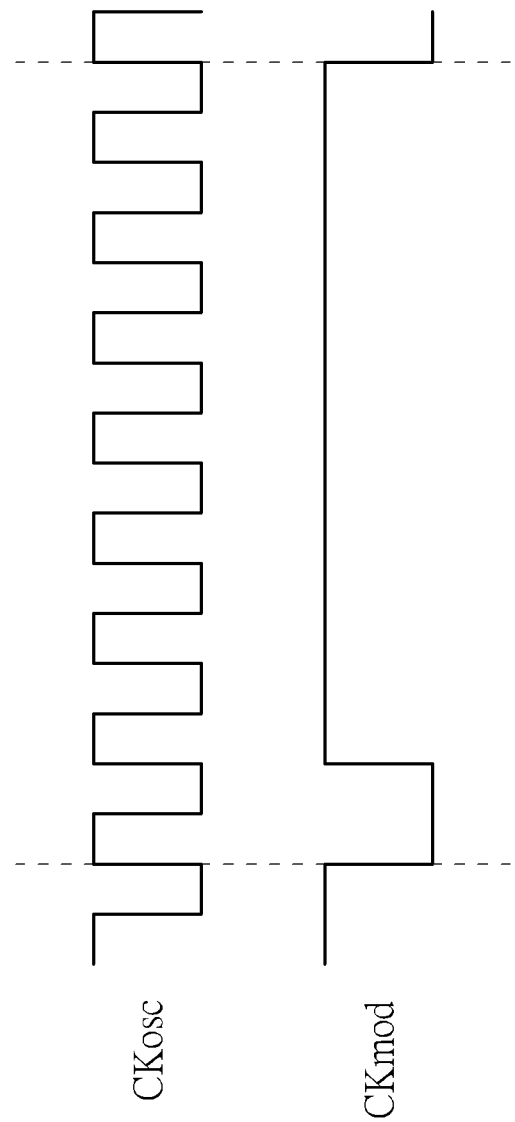
FIG. 7 is a diagram illustrating an output signal CKosc of the FLL shown in FIG. 6 and a modulation signal according to an embodiment of the present invention.

FIG. 7 is a diagram illustrating the output signal CKosc of the FLL 60 and a modulation signal CKmod according to an embodiment of the present invention, where the modulation signal CKmod may be an example of any of the modulation signals CKmod1 and CKmod2. During a predetermined period which comprises a predetermined number of cycles of the output signal CKosc, the modulation signal CKmod may be modulated to have the logic low state during a first period of the predetermined period and have the logic high state during a second period of the predetermined period. For example, during a period comprising eight cycles of the output signal CKosc, the modulation signal CKmod may be modulated to have the logic low state during a period comprising one cycle of the output signal CKosc and have the logic high state during a period comprising seven cycles of the output signal CKosc, where a duty cycle of the modulation signal CKmod may be (7/8). It should be noted that the duty cycle of the modulation signal CKmod do not have to be constant. For example, the duty cycle of the modulation signal CKmod may be switching between integer multiples of (1/8) in order to make the modulation signal CKmod have an average duty cycle that is substantially equal to a non-integer multiple of (1/8).

Figure 8A:
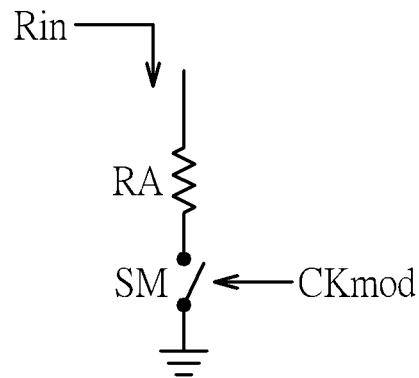
FIG. 8A is a diagram illustrating a resistor set having an equivalent resistance according to an embodiment of the present invention.

FIG. 8A is a diagram illustrating a resistor set having an equivalent resistance Rin according to an embodiment of the present invention, where the resistor set shown in FIG. 8A may be an example of any of the first resistor set RM1 and the second resistor set RM2. As shown in FIG. 8A, the resistor set may comprise a resistor RA and a modulation switch SM. Under a condition where the first resistor set RM1 is implemented based on the resistor set shown in FIG. 8A, the resistor RA is coupled to the first switched capacitor circuit 651, and the modulation switch SM is coupled between the resistor RA and a reference voltage terminal (e.g., the terminal providing the ground voltage), where the modulation switch SM is controlled by the modulation signal CKmod. According to the embodiment of FIG. 8A, when the modulation signal CKmod is at the logic high state, the equivalent resistance Rin may be RA; and when the modulation signal CKmod is at the logic low state, the equivalent resistance Rin may be infinity. Thus, the equivalent resistance Rin may be controlled between a tuning range from RA to infinity according to the duty cycle (or the average duty cycle) of the modulation signal CKmod. For example, when the duty cycle (or the average duty cycle) of the modulation signal CKmod is M, the equivalent resistance Rin may be (RA/M).

Figure 8B:
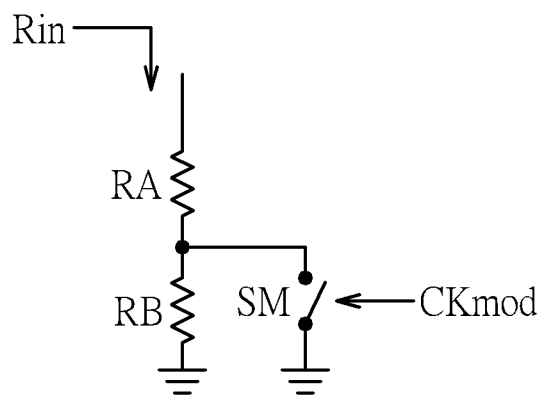
FIG. 8B is a diagram illustrating a first scheme for improving resolution of adjusting the equivalent resistance of the resistor set shown in FIG. 8A according to an embodiment of the present invention.

FIG. 8B is a diagram illustrating a first scheme for improving resolution of adjusting the equivalent resistance Rin of the resistor set shown in FIG. 8A according to an embodiment of the present invention. In addition to the resistor RA and the modulation switch SM, the resistor set may further comprise a resistor RB, where the resistor RB is coupled between the resistor RA and the reference voltage terminal (e.g., the terminal providing the ground voltage) in this embodiment. According to the embodiment of FIG. 8B, when the modulation signal CKmod is at the logic high state, the equivalent resistance Rin may be RA; and when the modulation signal CKmod is at the logic low state, the equivalent resistance Rin may be (RA+RB) which represents a resistance of the resistors RA and RB connected in series. Thus, the equivalent resistance Rin may be controlled between a tuning range from RA to (RA+RB) according to the duty cycle (or the average duty cycle) of the modulation signal CKmod. For example, when the duty cycle (or the average duty cycle) of the modulation signal CKmod is M, the equivalent resistance Rin may be expressed by M×(RA+RB)+(1−M)×RA. As the tuning range of the equivalent resistance Rin shown in FIG. 8B is reduced in comparison with the embodiment of FIG. 8A, the resolution of adjusting the equivalent resistance Rin can be improved.

Figure 8C:
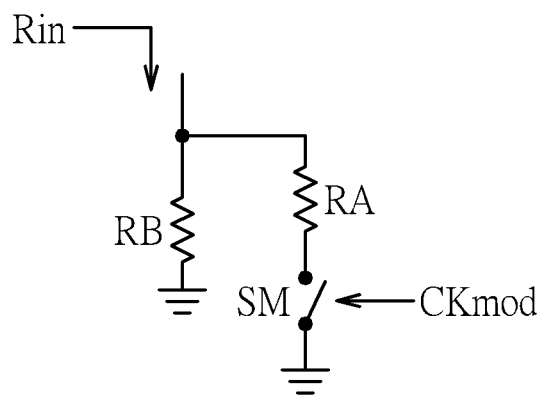
FIG. 8C is a diagram illustrating a second scheme for improving resolution of adjusting the equivalent resistance of the resistor set shown in FIG. 8A according to an embodiment of the present invention.

FIG. 8C is a diagram illustrating a second scheme for improving resolution of adjusting the equivalent resistance Rin of the resistor set shown in FIG. 8A according to an embodiment of the present invention. In this embodiment, the resistor RB is coupled between the first switched capacitor circuit 651 and the reference voltage terminal (e.g., the terminal providing the ground voltage). According to the embodiment of FIG. 8C, when the modulation signal CKmod is at the logic high state, the equivalent resistance Rin may be (RA//RB) which represents a resistance of the resistors RA and RB connected in parallel; and when the modulation signal CKmod is at the logic low state, the equivalent resistance Rin may be RB. Thus, the equivalent resistance Rin may be controlled between a tuning range from (RA//RB) to RB according to the duty cycle (or the average duty cycle) of the modulation signal CKmod. For example, when the duty cycle (or the average duty cycle) of the modulation signal CKmod is M, the equivalent resistance Rin may be expressed by M×(RB)+(1−M)×(RA//RB). As the tuning range of the equivalent resistance Rin shown in FIG. 8C is reduced in comparison with the embodiment of FIG. 8A, the resolution of adjusting the equivalent resistance Rin can be improved.

The above description takes the first resistor set RM1 being implemented based on the embodiments of FIGS. 8A to 8C as an example for better illustration, where related details of the second resistor set RM2 being implemented based on any of the embodiments of FIGS. 8A to 8C may be deduced by analogy, and are therefore omitted here for brevity.

Figure 9:
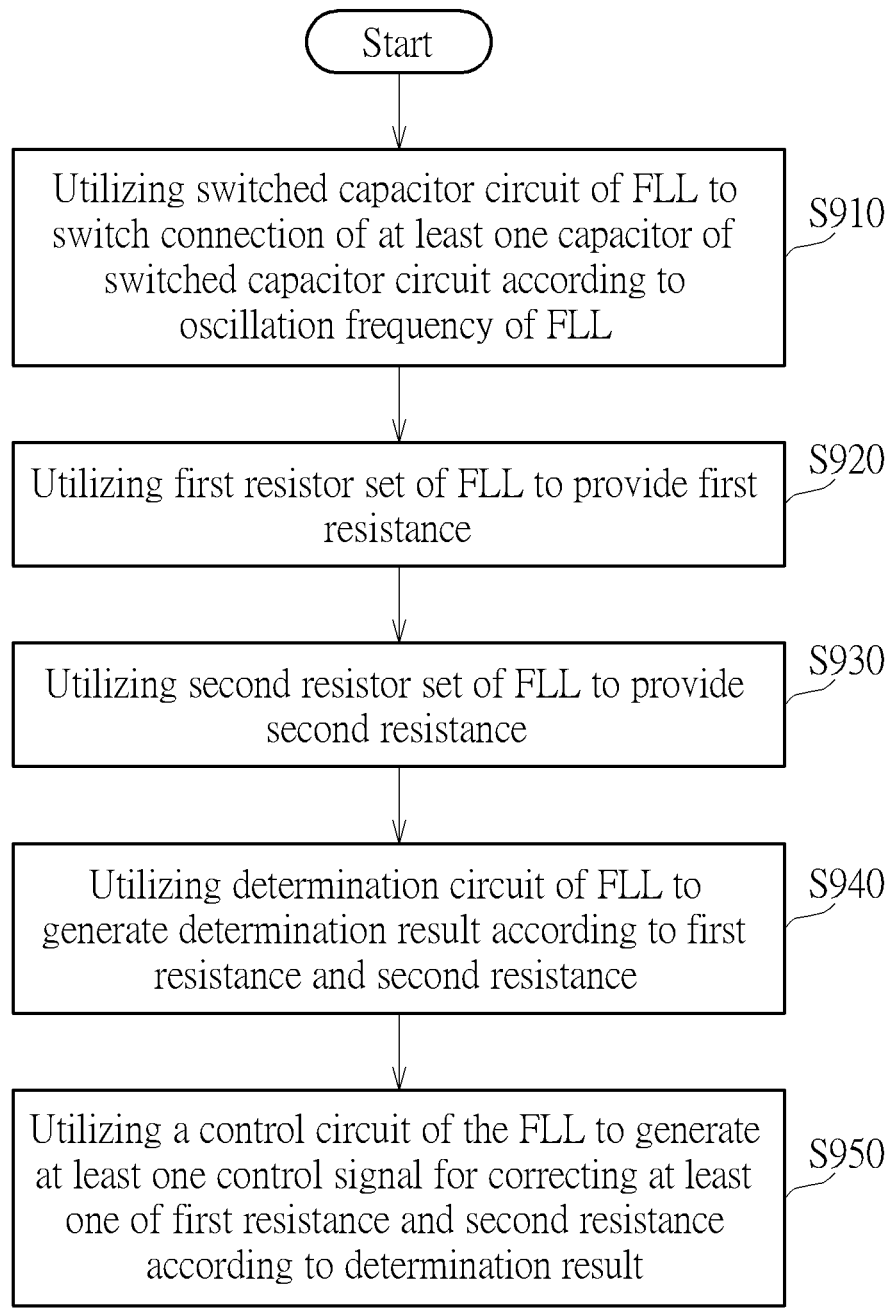
FIG. 9 is a diagram illustrating a working flow of a method for correcting an oscillation frequency of an output signal of an FLL according to an embodiment of the present invention.

FIG. 9 is a diagram illustrating a working flow of a method for correcting an oscillation frequency of an output signal (e.g., the output signal CKosc shown in FIG. 1 or FIG. 6) of an FLL (e.g., the FLL 10 shown in FIG. 1 or the FLL 60 shown in FIG. 6) according to an embodiment of the present invention. It should be noted that the working flow shown in FIG. 9 is for illustrative purposes only, and is not meant to be a limitation of the present invention. In some embodiments, one or more steps may be added, deleted or modified in the working flow shown in FIG. 9. In addition, if a same result may be obtained, these steps do not have to be executed in the exact order shown in FIG. 9.

In Step S910, the FLL may utilize at least one switched capacitor circuit of the FLL to switch connection of at least one capacitor of the at least one switched capacitor circuit according to the oscillation frequency.

In Step S920, the FLL may utilize a first resistor set of the FLL to provide a first resistance.

In Step S930, the FLL may utilize a second resistor set of the FLL to provide a second resistance.

In Step S940, the FLL may utilize a determination circuit of the FLL to generate a determination result according to the first resistance and the second resistance.

In Step S950, the FLL may utilize a control circuit of the FLL to generate at least one control signal for correcting at least one of the first resistance and the second resistance according to the determination result, wherein the oscillation frequency is controlled by a capacitance of the at least one capacitor and at least one of the first resistance and the second resistance.

It should be noted that the output of the FLL (e.g., the FLL 10 shown in FIG. 1 and the FLL 60 shown in FIG. 6) of the present invention is not a phase information output, and the resistance correcting mechanism does not introduce any additional pole. Thus, when the loop filter 120 is a one-pole filter, an overall system of the FLL can be a one-pole system, which does not have stability concern. In addition, components for performing the resistance correction mentioned above will not greatly increase an overall circuit area of the FLL. Thus, the present invention can solve the problem of the related art without introducing any side effect or in a way that is less likely to introduce side effects.

Those skilled in the art will readily observe that numerous modifications and alterations of the device and method may be made while retaining the teachings of the invention.

Accordingly, the above disclosure should be construed as limited only by the metes and bounds of the appended claims.

What is claimed is:

1. A frequency-locked loop (FLL), comprising:
at least one switched capacitor circuit, comprising at least one capacitor, wherein connection of the at least one capacitor is switched according to an oscillation frequency of an output signal of the FLL;
a first resistor set, configured to provide a first resistance;
a second resistor set, configured to provide a second resistance;
a determination circuit, wherein the first resistor set generates a first monitored voltage according to the first resistance when the first resistor set is coupled to the determination circuit, the second resistor set generates a second monitored voltage according to the second resistance when the second resistor set is coupled to the determination circuit, and the determination circuit is configured to generate a determination result according to the first monitored voltage and the second monitored voltage; and
a control circuit, configured to generate at least one control signal for correcting at least one of the first resistance and the second resistance according to the determination result;
wherein the oscillation frequency is determined based on the at least one capacitor and the at least one of the first resistance and the second resistance.

2. The FLL of claim 1, wherein a first temperature coefficient of the first resistor set is different from a second temperature coefficient of the second resistor set.

3. The FLL of claim 1, further comprising:
a current source, coupled to the determination circuit, configured to provide a constant current;
a swapping circuit, coupled to the first resistor set, the second resistor set, the at least one switched capacitor circuit, and the current source;
wherein during a first phase, the swapping circuit controls the first resistor set to be coupled to the at least one switched capacitor circuit and controls the second resistor set to be coupled to the current source for generating the second monitored voltage according to the second resistance and the constant current; and during a second phase, the swapping circuit controls the second resistor set to be coupled to the at least one switched capacitor circuit and controls the first resistor set to be coupled to the current source for generating the first monitored voltage according to the first resistance and the constant current.

4. The FLL of claim 3, wherein when the determination result indicates that the first monitored voltage is greater than the second monitored voltage, the control circuit decreases the first resistance and increases the second resistance; and when the determination result indicates that the first monitored voltage is less than the second monitored voltage, the control circuit increases the first resistance and decreases the second resistance.

5. The FLL of claim 3, wherein the determination circuit comprises:
an amplifier, coupled to the current source, configured to receive the first monitored voltage and the second monitored voltage via a first input terminal of the amplifier;
a preset capacitor, coupled to a second input terminal of the amplifier, configured to store at least one of the first monitored voltage and the second monitored voltage; and
a preset switch, coupled between the second input terminal and an output terminal of the amplifier, configured to control configurations of the determination circuit;
wherein during the first phase, the preset switch is turned on, and the determination circuit is configured as a unit gain buffer to replicate the second monitored voltage from the first input terminal of the amplifier to the preset capacitor; and during the second phase, the preset switch is turned off, and the determination circuit is configured as a comparator to compare the first monitored voltage on the first input terminal of the amplifier with the second monitored voltage stored on the preset capacitor, in order to generate the determination result.

6. The FLL of claim 1, wherein any of the first resistor set and the second resistor set is a resistor ladder.

7. The FLL of claim 1, wherein the at least one switched capacitor circuit comprises:
a first switched capacitor circuit, coupled to the first resistor set, wherein connection of a first capacitor of the first switched capacitor circuit is switched according to the oscillation frequency;
a second switched capacitor circuit, coupled to the second resistor set, wherein connection of a second capacitor of the second switched capacitor circuit is switched according to the oscillation frequency;
wherein a first combined network comprising the first switched capacitor circuit and the first resistor set is configured to generate the first monitored voltage on a first input terminal of the determination circuit, and a second combined network comprising the second switched capacitor circuit and the second resistor set is configured to generate the second monitored voltage on a second input terminal of the determination circuit.

8. The FLL of claim 7, wherein any resistor set of the first resistor set and the second resistor set is controlled by a modulation signal, and an equivalent resistance of the any resistor set is determined according to a duty cycle of the modulation signal.

9. The FLL of claim 8, further comprises:
at least one delta-sigma modulator, coupled to the any resistor set, configured to modulate the output signal according to the at least one control signal, in order to generate the modulation signal.

10. The FLL of claim 8, wherein the any resistor set comprises:
a first resistor, coupled to the at least one switched capacitor circuit;
a modulation switch, coupled between the first resistor and a reference voltage terminal, wherein the modulation switch is controlled by the modulation signal.

11. The FLL of claim 10, wherein the any resistor set further comprises:
a second resistor, coupled between the first resistor and the reference voltage terminal.

12. The FLL of claim 10, wherein the any resistor set further comprises:
a second resistor, coupled between the at least one switched capacitor circuit and the reference voltage terminal.

13. A method for correcting an oscillation frequency of an output signal of a frequency-locked loop (FLL), comprising:

utilizing at least one switched capacitor circuit of the FLL to switch connection of at least one capacitor of the at least one switched capacitor circuit according to the oscillation frequency;

utilizing a first resistor set of the FLL to provide a first resistance and generating a first monitored voltage according to the first resistance when the first resistor set is coupled to a determination circuit of the FLL;

utilizing a second resistor set of the FLL to provide a second resistance and generating a second monitored voltage according to the second resistance when the second resistor set is coupled to the determination circuit;

utilizing the determination circuit of the FLL to generate a determination result according to the first monitored voltage and the second monitored voltage; and utilizing a control circuit of the FLL to generate at least one control signal for correcting at least one of the first resistance and the second resistance according to the determination result;

wherein the oscillation frequency is controlled by a capacitance of the at least one capacitor and the at least one of the first resistance and the second resistance.

14. The method of claim 13, wherein a first temperature coefficient of the first resistor set is different from a second temperature coefficient of the second resistor set.

15. The method of claim 13, further comprising:
utilizing a current source of the FLL to provide a constant current;
during a first phase, utilizing the swapping circuit to controls the first resistor set to be coupled to the at least one switched capacitor circuit and control the second resistor set to be coupled to the current source for generating the second monitored voltage according to the second resistance and the constant current; and
during a second phase, utilizing the swapping circuit to control the second resistor set to be coupled to the at least one switched capacitor circuit and control the first resistor set to be coupled to the current source for generating the first monitored voltage according to the first resistance and the constant current.

16. The method of claim 15, wherein utilizing the control circuit of the FLL to generate the at least one control signal for correcting the at least one of the first resistance and the second resistance according to the determination result comprises:
in response to the determination result indicating that the first monitored voltage is greater than the second monitored voltage, utilizing the control circuit to decrease the first resistance and increase the second resistance.

17. The method of claim 15, wherein utilizing the control circuit of the FLL to generate the at least one control signal for correcting the at least one of the first resistance and the second resistance according to the determination result comprises:
in response to the determination result indicating that the first monitored voltage is less than the second monitored voltage, utilizing the control circuit to increase the first resistance and decrease the second resistance.

18. The method of claim 13, wherein utilizing the at least one switched capacitor circuit of the FLL to switch the connection of the at least one capacitor of the at least one switched capacitor circuit according to the oscillation frequency comprises:
utilizing a first switched capacitor circuit of the at least one switched capacitor circuit to switch connection of a first capacitor of the first switched capacitor circuit according to the oscillation frequency;
utilizing a first combined network comprising the first switched capacitor circuit and the first resistor set to generate the first monitored voltage on a first input terminal of the determination circuit;
utilizing a second switched capacitor circuit of the at least one switched capacitor circuit to switch connection of a second capacitor of the second switched capacitor circuit according to the oscillation frequency; and
utilizing a second combined network comprising the second switched capacitor circuit and the second resistor set to generate the second monitored voltage on a second input terminal of the determination circuit.

19. The method of claim 18, wherein any resistor set of the first resistor set and the second resistor set is controlled by a modulation signal, and an equivalent resistance of the any resistor set is determined according to a duty cycle of the modulation signal.

20. The method of claim 19, further comprises:
utilizing at least one delta-sigma modulator to modulate the output signal according to the at least one control signal, in order to generate the modulation signal.

* * * * *